(12) United States Patent
Su et al.

(10) Patent No.: US 7,906,425 B2
(45) Date of Patent: Mar. 15, 2011

(54) FLUXLESS BUMPING PROCESS

(75) Inventors: Chao-Yuan Su, Koahsiung (TW); Chia-Fu Lin, Hsin-Chu (TW); Hsin-Hui Lee, Kaoshiugh (TW); Yen-Ming Chen, Hsin-Chu (TW); Kai-Ming Ching, Taiping (TW); Li-Chih Chen, Taipei (TW); Wen-Chang Kuo, Hsin-Chu (TW); Yue-Ying Jian, Nantoa (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 736 days.

(21) Appl. No.: 11/581,122

(22) Filed: Oct. 13, 2006

(65) Prior Publication Data
US 2007/0028445 A1 Feb. 8, 2007

Related U.S. Application Data

(62) Division of application No. 10/170,745, filed on Jun. 13, 2002, now Pat. No. 7,134,199.

(51) Int. Cl.
*H01L 21/00* (2006.01)
(52) U.S. Cl. ................................. 438/614; 257/E23.021
(58) Field of Classification Search .......... 438/106–127, 438/612–617; 257/E23.021
See application file for complete search history.

(56) References Cited

U.S. PATENT DOCUMENTS 6,250,540 B1 * 6/2001 Egitto et al. .................. 228/205

* cited by examiner

*Primary Examiner* — Richard A. Booth
(74) *Attorney, Agent, or Firm* — Tung & Associates

(57) ABSTRACT

A process including providing a semiconductor device including a bond pad, and an under bump metallurgy overlying the bond pad. Forming a solder structure over the under bump metallurgy, and wherein the solder structure includes an outer layer including tin oxide. Producing a plasma from at least one of $CF_4$ and $SF_6$, and exposing the solder structure to the plasma. Heating the solder structure and cooling the same to provide a solder bump on the semiconductor device.

10 Claims, 2 Drawing Sheets

FLUXLESS BUMPING PROCESS

This is a divisional of application Ser. No. 10/170,745 filed on Jun. 13, 2002 now U.S. Pat. No. 7,134,199.

FIELD OF THE INVENTION

This invention relates to a method of making an electrically conductive bump on a substrate, and more particularly to a method of making an electrically conductive bump on a substrate without using a traditional flux.

BACKGROUND OF THE INVENTION

It is common in the semiconductor industry to make an electrically conductive bump on a substrate, and in particular to make a solder bump on a semiconductor device. Solder bumps are often formed on an integrated circuit chip to make a flip chip. A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit.

After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM. The portions of the UBM are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25-125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

One of the most cost-effective packaging techniques is known as direct chip attach wherein a solder bumped flip chip is directly attached to a printed circuit board. However, due to the thermal expansion mismatch between the silicon chip and the printed circuit board (made from an epoxy or fiberglass material), an underfill encapsulant is usually needed for solder joint reliability. Due to the underfill operation, the manufacturing costs is increased in the manufacturing throughput is often substantially reduced. Further, reworking an underfill flip chip on a printed circuit board is practically impossible.

Although electrically conductive bumps, such as solder bumps, are more frequently used with flip chips, electrically conductive bumps are often applied to other semiconductor devices, printed circuit boards, and ceramic substrates. Typically the forming of solder bumps is accomplished using a flux, which in the semiconductor industry usually is an organic oxide. FIGS. 1A-F illustrate the steps of a typical prior art process of forming a solder bump on a substrate. In FIG. 1A a semiconductor device 10 is provided including a silicon based substrate 12 with a plurality of alternating metallization and dielectric layers. A bond pad 14 is provided over the silicon based substrate 12. A passivation layer 16 is provided over the silicon based substrate 12 and includes an opening down to the bond pad 14. An under bump metallurgy 18 is provided over the passivation layer 16 and into the opening formed a passivation layer 16 and is connected to the bond pad 14. In FIG. 1B a sacrificial layer 20 is provided which typically is a photoresist layer that has been deposited, patterned and developed to provide an opening 22 therein overlying the bond pad 14. In FIG. 1C, solder 24 may be deposited into the opening 22 formed in the sacrificial layer 20 and onto the under bump metallurgy 18. The solder 24 may be deposited by any of a variety of methods including electroplating or screen printing. As shown in FIG. 1D the sacrificial layer 20 is then removed to provide a solder structure 26 on top of the under bump metallurgy 18. It is typical for the solder structure 26 to form an oxide layer 32, more particularly thin oxide ($SnO_x$) upon exposure to the air for even short periods of time. Excess under bump metallurgy 18 is removed typically by etching using the solder structure 26 as a mask, and then as shown in FIG. 1E, a solder flux 28 is deposited over the solder structure 26. The flux is particularly needed if the solder is electroplated onto the substrate because an electroplated solder structure would not have flux included in the composition of the solder. The purpose of the solder flux is to reduce the oxide on the surface to be heated or material (solder) to be reflown. The reduction of the oxides allows the solder to flow at a lower temperature. As shown in FIG. 1F, the solder structure 26 with the flux 28 is heated to reflow the solder structure 26 and then cooled to form a solder bump 30 on the silicon based substrate 12.

However, the use of a flux agent requires additional applications steps, additional process equipment tools and often follow-up cleanup steps to remove flux residue. Flux residue also has associated with it a high risk of reliability due to corrosion caused by the flux residue. The present invention provides alternatives to and advantages over the prior art.

SUMMARY OF THE INVENTION

One embodiment of the invention includes a process including providing a substrate having an electrically conductive structure thereon, the electrically conductive structure including an outer surface including a compound including an oxide group. Converting the compound including the oxide group to a compound including an oxy-halide group thereby reducing the melting temperature of the outer surface. Heating the electrically conductive structure including the compound including the oxy-halide group and cooling the same to form an electrically conductive bump on the substrate.

In another embodiment of the invention the converting of the compound including the oxide group to the compound including an oxy-halide group comprises exposing the electrically conductive material to a plasma containing halide ions.

In another embodiment of the invention the halide ions comprise F ions.

Another embodiment of the invention further includes producing a plasma from a gas including at least one of carbon tetrafluoride and sulfur tetrafluoride and wherein converting the compound including the oxide group to a compound including the oxy-halide group comprises exposing the electrically conductive material to the plasma.

Another embodiment of the invention includes a process including providing a substrate having a solder structure thereon, the solder structure including an outer surface including tin oxide. Converting the tin oxide to tin oxy-halide thereby reducing the melting temperature of the outer surface. Heating the solder structure including the tin oxy-halide and cooling the same to form a solder bump on the substrate.

In another embodiment of the invention the converting of the tin oxide to tin oxy-halide comprises exposing the solder to a plasma including halide ions.

In another embodiment of the invention the halide ions comprise F ions.

Another embodiment of the invention includes providing a semiconductor device including a bond pad, and an under bump metallurgy overlying the bond pad. Forming a solder structure over the under bump metallurgy, and wherein the solder structure includes an outer layer including tin oxide. Converting the tin oxide to tin oxy-halide to reduce the melting temperature of the outer layer. Heating the solder structure and cooling the same to provide a solder bump on the semiconductor device.

Another embodiment of the invention includes providing a semiconductor device including a bond pad, and an under bump metallurgy overlying the bond pad. Forming a solder structure over the under bump metallurgy, and wherein the solder structure includes an outer layer including tin oxide. Producing a plasma from at least one of $CF_4$ and $SF_6$, and exposing the solder structure to the plasma. Heating the solder structure and cooling the same to provide a solder bump on the semiconductor device.

In another embodiment of the invention the forming of the solder structure comprises forming a sacrificial layer over the semiconductor device, and the sacrificial layer having an opening therein overlying the under bump metallurgy, depositing solder into the opening, and removing the sacrificial layer to provide the solder structure.

In another embodiment of the invention the depositing of the solder into the opening comprises electroplating solder into the opening.

In another embodiment of the invention the depositing of the solder into the opening comprises screen printing a fluxless solder composition into the opening.

Another embodiment of the invention includes providing a semiconductor device including a solder structure thereon, the solder structure including an outer surface including tin oxide. Exposing the outer surface to a plasma including F ions. Reflowing the solder structure to form a solder bump on the semiconductor device.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

Figure 1A:
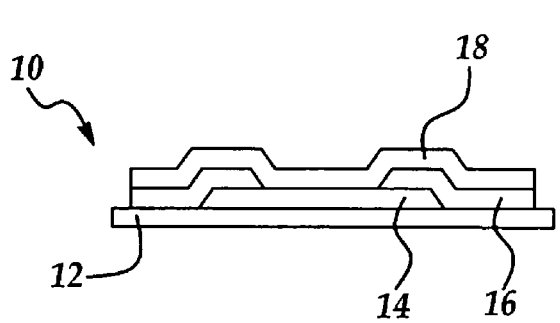
FIG. 1A illustrates the forming of an under bump metallurgy over a semiconductor substrate, bond pad, and passivation layer overlying the substrate that includes an opening down to the bond pad according to a prior art process.
Figure 1B:
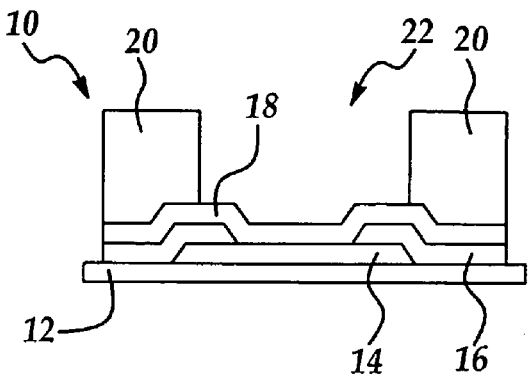
FIG. 1B illustrates the forming of a sacrificial layer having an opening therein down to the under bump metallurgy of the structure in FIG. 1A according to a prior art process.
Figure 1C:
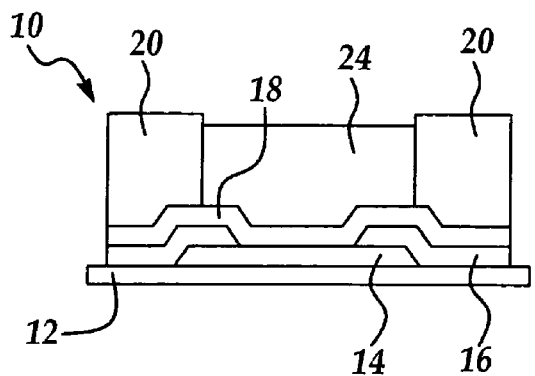
FIG. 1C illustrates the depositing of solder into the opening in the sacrificial layer and onto the under bump metallurgy according to a prior art process.
Figure 1D:
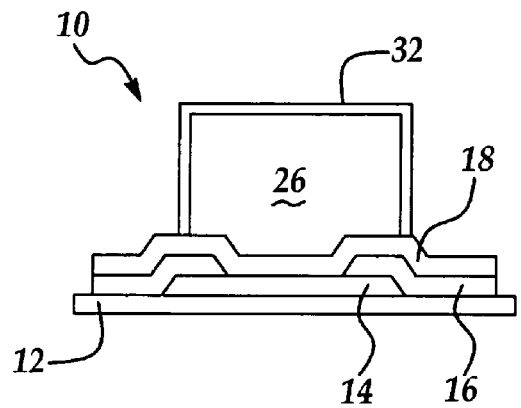
FIG. 1D illustrates the removing of the sacrificial layer to provide a solder structure on the under bump metallurgy according to a prior art process.
Figure 1E:
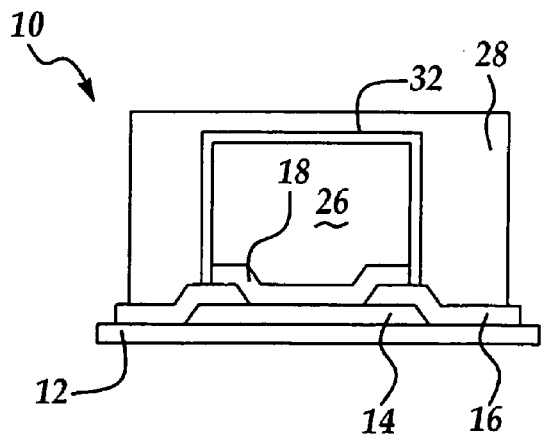
FIG. 1E illustrates the depositing of a flux over the solder structure according to a prior art process.
Figure 1F:
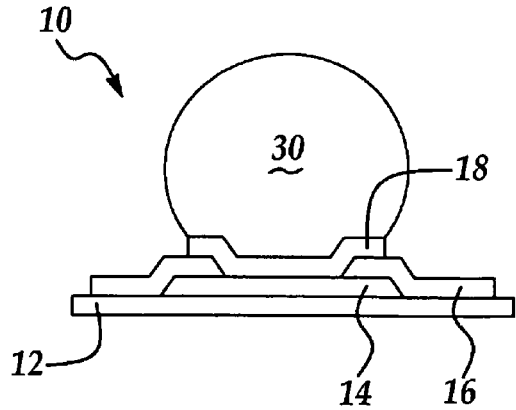
FIG. 1F illustrates the heating of the solder structure and the flux and cooling the same to form solder bump on a semiconductor device according to a prior art process.
Figure 2A:
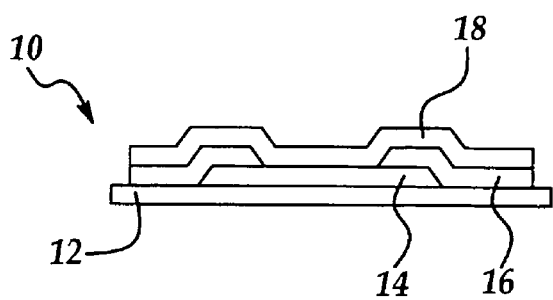
FIG. 2A illustrates the forming of an under bump metallurgy over a semiconductor substrate, bond pad, and passivation layer overlying the substrate that includes an opening down to the bond pad according to the present invention.
Figure 2B:
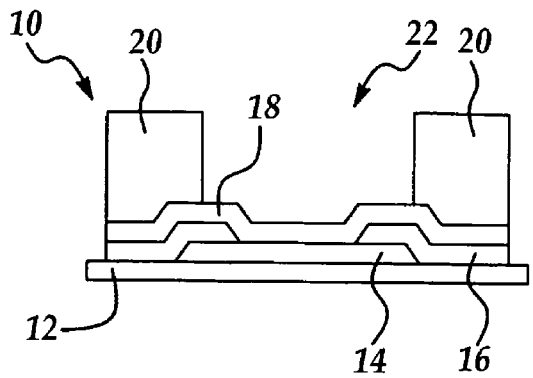
FIG. 2B illustrates the forming of a sacrificial layer having an opening therein down to the under bump metallurgy of the structure in FIG. 1A according to the present invention.
Figure 2C:
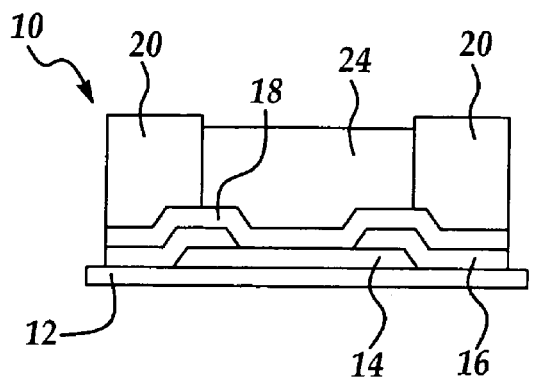
FIG. 2C illustrates the depositing of an electrically conductive material into the opening in the sacrificial layer and over the under bump metallurgy according to the present invention.
Figure 2D:
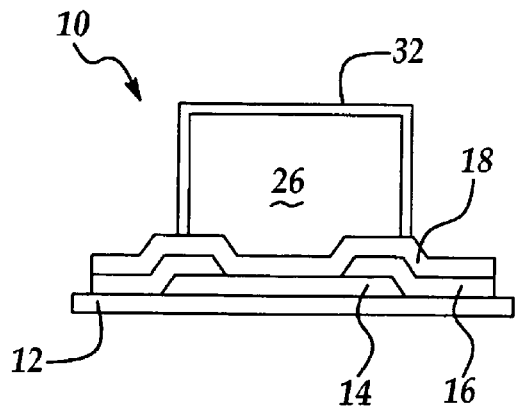
FIG. 2D illustrates the removing of the sacrificial layer to provide an electrically conductive structure (including an oxide layer) over the under bump metallurgy according to the present invention.
Figure 2E:
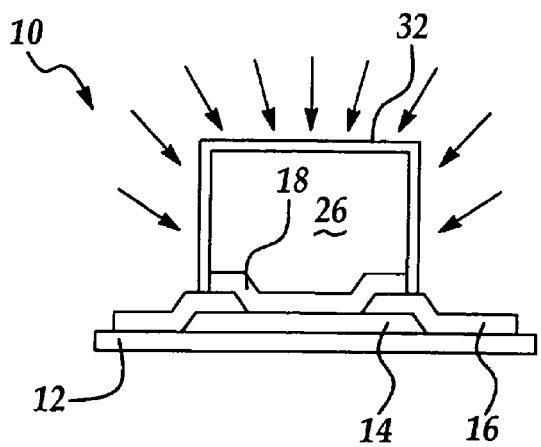
FIG. 2E illustrates the converting of the oxide on the electrically conductive structure to an oxy-halide according to the present invention.
Figure 2F:
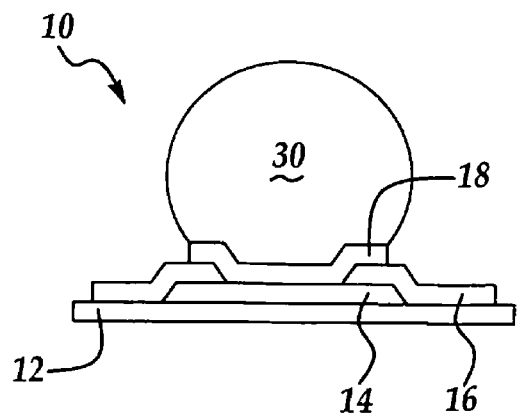
FIG. 2F illustrates heating of the electrically conductive structure and cooling the same to form an electrically conductive bump on a semiconductor device according to the present invention.

FIGS. 2A-F illustrate the forming of an electrically conductive bump on a substrate according to the present invention. In FIG. 1A a semiconductor device 10 is provided including a silicon based substrate 12 (such as a semiconductor wafer) with a plurality of alternating metallization and dielectric layers (not shown). A bond pad 14 is provided over the silicon based substrate 12. A passivation layer 16 is provided over the silicon based substrate 12 and includes an opening down to the bond pad 14. An under bump metallurgy 18 is provided over the passivation layer 16 and into the opening formed in the passivation layer 16 and is connected to the bond pad 14. In FIG. 2B a sacrificial layer 20 is provided which typically is a photoresist layer that has been deposited, patterned and developed to provide an opening 22 therein overlying the bond pad 14. In FIG. 2C, an electrically conductive material 24 such as a material including solder, gold, copper, aluminum and/or nickel (or any other bumping material known to those skilled in the art) may be deposited into the opening 22 formed in the sacrificial layer 20 and over the under bump metallurgy 18. Preferably the electrically conductive material 24 includes solder in any composition known to those skilled in the art including 63 weight percent Sn and 37 weight percent Pb. The electrically conductive material 24 may be deposited by any of a variety of methods including electroplating, screen printing, evaporation, electroless plating, jet printing, micro-punching or any other method known to those skilled in the art. As shown in FIG. 2D the sacrificial layer 20 is then removed to provide an electrically conductive structure 26 on top of the under bump metallurgy 18. It is typical for the electrically conductive structure 26 to form an oxide layer 32, more specifically tin oxide ($SnO_x$) in the case of solder, upon exposure to the air for even short periods of time. Excess under bump metallurgy is removed typically by etching using the electrically conductive structure 26 as a mask, and then as shown in FIG. 2E, the oxide layer is converted to an oxy-halide which reduces the reflow temperature of the electrically conductive structure 26. Preferably this is accomplished by providing a plasma of halide ions, and more preferably a plasma of F ions, and exposing the electrically conductive structure (preferably solder) to the plasma of halide ions to convert the oxides to oxy-halides. The plasma of halide ions can be provided by exciting gas molecules containing halide atoms, such as $CF_4$ or $SF_6$. In a preferred embodiment the electrically conductive structure 26 includes solder having tin oxide which may be in the form of $SnO_x$. Exposing the $SnO_x$ to a plasma including F ions converts the $SnO_x$ to $SnO_xF_y$. The reduction or conversion of the oxides to oxy-halides allows the electrically conductive material or solder to flow at a lower temperature. As shown in FIG. 2F, the electrically conductive structure 26 with the outer surface including oxy-halides is heated to reflow the electrically conductive structure 26 and then cooled to form an electrically conductive bump 30 (preferably solder bump) on the silicon based substrate 12. The invention is particularly applicable to electrically conductive structures 26 that have been deposited over formed from a composition that is substantially free of flux agents or has no flux agents. The invention is a fluxless method of forming bumps on a substrate.

The invention claimed is:

1. A process comprising:
    providing a semiconductor device including a bond pad, and an under bump metallurgy overlying the bond pad;
    forming a fluxless electrically conductive solder structure over the under bump metallurgy, and wherein the solder structure includes an outer layer including tin oxide;
    converting the tin oxide to tin oxy-halide to reduce the melting temperature of the outer layer; and
    heating to reflow in the absence of flux the solder structure including reflowing a bulk of said solder structure and cooling the same to provide an electrically conductive solder bump with a truncated spherical shape on the under bump metallurgy, said heating following said converting, said electrically conductive solder bump having a different bulk shape than said electrically conductive solder structure, said step of heating to reflow without joining said solder structure to another structure.

2. A process as set forth in claim 1 wherein the converting of the tin oxide to tin oxy-halide comprises exposing the solder structure to a plasma including halide ions.

3. A process as set forth in claim 1 wherein the converting of the tin oxide to tin oxy-halide comprises exposing the solder structure to a plasma including F ions.

4. A process as set forth in claim 1 wherein tin oxy-halide comprises tin oxy-fluoride.

5. A process comprising:
    providing a semiconductor device including a bond pad, and an under bump metallurgy overlying the bond pad;
    forming a solder structure over the under bump metallurgy, and wherein the solder structure includes an outer layer including tin oxide;
    producing a plasma from at least one of $CF_4$ and $SF_6$, and exposing the solder structure to the plasma; and
    heating to reflow in the absence of flux the solder structure including reflowing a bulk of said solder structure and cooling the same to provide a solder bump with a truncated spherical shape on the under bump metallurgy, said heating following said exposing, said solder bump having a different bulk shape than said solder structure, said step of heating to reflow without joining said solder structure to another structure.

6. A process as set forth in claim 5 wherein the forming of the solder structure comprises electroplating solder onto the semiconductor device.

7. A process as set forth in claim 5 wherein the forming of the solder structure comprises screen printing a solder composition onto the semiconductor device.

8. A process as set forth in claim 5 wherein the forming of the solder structure comprises forming a sacrificial layer over the semiconductor device, and the sacrificial layer having an opening therein overlying the under bump metallurgy, and depositing solder into the opening, and removing the sacrificial layer to provide the solder structure.

9. A method as set forth in claim 8 wherein the depositing of the solder into the opening comprises electroplating the solder into the opening.

10. A process as set forth in claim 8 wherein the depositing of the solder into the opening comprises screen printing a fluxless solder composition into the opening.

* * * * *